United States Patent
Crain et al.

(10) Patent No.: US 10,312,920 B2
(45) Date of Patent: Jun. 4, 2019

(54) BASELINE WANDER COMPENSATION

(71) Applicant: Cavium, LLC, Santa Clara, CA (US)

(72) Inventors: Ethan Crain, Northborough, MA (US); Lu Wang, Framingham, MA (US)

(73) Assignee: Cavium, LLC, Santa Clara, CA (US)

(*) Notice: Subject to any disclaimer, the term of this patent is extended or adjusted under 35 U.S.C. 154(b) by 0 days.

(21) Appl. No.: 15/719,973

(22) Filed: Sep. 29, 2017

(65) Prior Publication Data

US 2019/0103875 A1 Apr. 4, 2019

(51) Int. Cl.
*H03L 5/00* (2006.01)
*H04L 7/00* (2006.01)
*H04L 25/03* (2006.01)
*H03L 7/08* (2006.01)
*H04L 7/04* (2006.01)
*H04L 7/033* (2006.01)

(52) U.S. Cl.
CPC .............. *H03L 7/0807* (2013.01); *H03L 5/00* (2013.01); *H04L 7/0087* (2013.01); *H04L 7/048* (2013.01); *H04L 25/03057* (2013.01); *H04L 7/0331* (2013.01)

(58) Field of Classification Search
USPC ....... 375/219, 220, 221, 222, 229, 232, 233, 375/240, 240.26, 240.27, 259, 285, 278, 375/284, 295, 296, 316, 318, 324, 346, 375/340, 347, 350
See application file for complete search history.

(56) References Cited

U.S. PATENT DOCUMENTS

| | | | | |
|---|---|---|---|---|
| 5,333,201 | A * | 7/1994 | Waller, Jr. | H04S 3/02 381/22 |
| 6,614,842 | B1 * | 9/2003 | Chou | H03H 17/06 375/232 |
| RE40,038 | E * | 1/2008 | Shakiba | H04L 25/063 327/307 |
| 8,447,000 | B2 * | 5/2013 | Manickam | H04L 25/03254 375/285 |
| 8,483,318 | B2 * | 7/2013 | Karlquist | H03H 7/46 375/219 |
| 9,014,252 | B2 * | 4/2015 | Dong | H04L 25/03178 375/229 |
| 9,306,775 | B1 * | 4/2016 | Kotagiri | H04L 25/03019 |
| 9,485,120 | B1 * | 11/2016 | Sun | H04L 25/03057 |
| 2012/0155528 | A1 * | 6/2012 | Zhong | A61B 5/7225 375/232 |
| 2014/0023134 | A1 * | 1/2014 | Zhong | A61B 5/7225 375/233 |
| 2016/0080176 | A1 * | 3/2016 | Kotagiri | H04L 25/03019 375/232 |
| 2018/0358953 | A1 * | 12/2018 | den Besten | H03H 17/0219 |

* cited by examiner

*Primary Examiner* — Linda Wong
(74) *Attorney, Agent, or Firm* — Hamilton, Brook, Smith & Reynolds, P.C.

(57) ABSTRACT

A data recovery circuit provides compensation for baseline wander exhibited by a data signal. An adaptive equalizer generates a recovered data signal from a data input. A level shifter and low-pass filter provide a compensation signal as a function of the recovered data signal. An adaptation engine adjusts the level of the compensation signal to compensate for baseline wander. The adaptive equalizer generates the recovered data signal as a function of the data input and the compensation signal, thereby providing accurate recovery of the data signal.

17 Claims, 8 Drawing Sheets

BASELINE WANDER COMPENSATION

BACKGROUND

Driven by the fast advancement of applications in several fields of technology, such as cloud computing, autonomous vehicle, and virtual reality, the demand for increasing data throughput is greater than ever before. A typical hardware platform often employs multi-Gbps serial data links, such as PCI express, Ethernet, and serial ATA (SATA). The challenge for transferring data at such high speed with low-cost hardware, such as an FR4 Printed Circuit Board (PCB), is that a transmission channel through which the data is transferred, can cause severe inter-symbol interference (ISI) as a result of being high-loss, non-linear, and/or reflective. ISI degrades the data received by a receiver, such as a serializer/deserializer (SerDes) receiver, where the degradation can include reduced eye height and eye width of the received data signal. Such degradation can increase at higher speeds of data transfer, leading to errors in the sampling of the data signal.

SUMMARY

Example embodiments include a circuit for recovering data. An AC-coupling network may receive a data input signal and output a high-pass filtered data signal. An adaptive equalizer, such as a decision feedback equalizer (DFE), may be configured to output a recovered data signal. A level shifter may be configured to output a level-shifted signal as a function of the recovered data signal, and a low-pass filter may be configured to output a low-pass filtered signal as a function of the level-shifted signal. The low-pass filtered signal may correspond to a low-frequency component of the data input signal. The adaptive equalizer may generate the recovered data signal as a function of the low-pass filtered signal and the high-pass filtered data signal. An adaptation engine may be configured to control the level shifter to adjust an amplitude of the level-shifted signal as a function of the recovered data signal.

In further embodiments, a comparator (e.g., a differential amplifier) may be configured to receive a first input combining the low-pass filtered signal and high-pass filtered data signal, the comparator outputting an error signal to the adaptation engine. The comparator may receive a second input corresponding to the recovered data signal, where the comparator outputs the error signal as a function of a difference between the first and second inputs. The adaptation engine may adjust the amplitude of the level-shifted signal as a function of the error signal. Further, a deserializer may be configured to convert the error signal to a parallel error signal, which may then be received by the adaptation engine as a factor in controlling the amplitude of the level shifter.

Further embodiments may include a combiner configured to combine the high-pass filtered data signal and low-pass filtered signal and output a combined data signal. The adaptive equalizer may be further configured to output the recovered data signal as a function of the combined data signal. The deserializer may also convert the recovered data signal to a parallel data signal, which may be received by the adaptation engine to determine the amplitude of the level shifter.

Still further embodiments may include a method of recovering a data signal. A data input signal may be filtered at an AC-coupling network to generate a high-pass filtered data signal. A recovered data signal may be level-shifted to generate a level-shifted signal, and the level-shifted signal may be filtered to output a low-pass filtered signal corresponding to a low-frequency component of the data input signal. The recovered data signal may be generated as a function of the low-pass filtered signal and the high-pass filtered data signal. Further, an amplitude of the level-shifted signal may be adjusted as a function of the recovered data.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

DETAILED DESCRIPTION

A description of example embodiments follows.

High-speed serial data links typically employ AC coupling to decouple the common-mode voltage of a serializer/deserializer (SerDes) transmitter and a SerDes receiver, which can remove any transmitter offset and allows the receiver to be biased at optimal condition without affecting the transmitter. However, the use of AC-coupling capacitor can introduce a low-frequency pole into the system transfer function, which acts as a high-pass filter (HPF) to the input data. If the incoming data stream exhibits a long string of consecutive "−1s" or "1s," having its energy mostly in the lower frequency spectrum, it may be largely attenuated by the high-pass AC-coupling network. Thus, the baseline voltage of the differential signal may migrate from an ideal voltage (e.g., 0 V) based on the data pattern, thereby degrading the received data quality. This phenomenon is known as baseline wander (BLW). Typical solutions to mitigate BLW include the use of larger AC-coupling capacitors to decouple the common-mode voltage of the SerDes transmitter and receiver. However, limited on-chip real-estate often restricts the use of such large passive components.

Further, when a data signal is transferred through a high-pass AC-coupling network such as the network described above, the data signal may lose its low-frequency content. If the lost low-frequency content can be added back to the high-passed data, then the data signal can be recovered. However, a circuit that merely provides a low-pass filter (LPF) in parallel at the receiver to generate the low-frequency content, and combine it with the high-passed data, may increase the load at a receiver. Alternatively, a decision feedback equalizer (DFE) or other adaptive equalizer may be implemented to recover digitized data, which is then coupled to the input of the LPF, thereby avoiding the additional load at the receiver. However, this technique requires the low-frequency content of the recovered data to be almost the same as that of the input data, including the signal amplitude. Yet the amplitude of the DFE output and the input data are often different due to inherent circuit differences as well as variations among channels linking the transmitter and the receiver, which can differ from one printed circuit board (PCB) to another.

Example embodiments provide for compensating for BLW (also referred to as baseline wander compensation (BLWC)) and maintain fidelity of a received data signal. In one embodiment, a self-adaptive BLWC method can be used with different types of transmitters and channels, while also achieving optimal compensation results.

Figure 1:
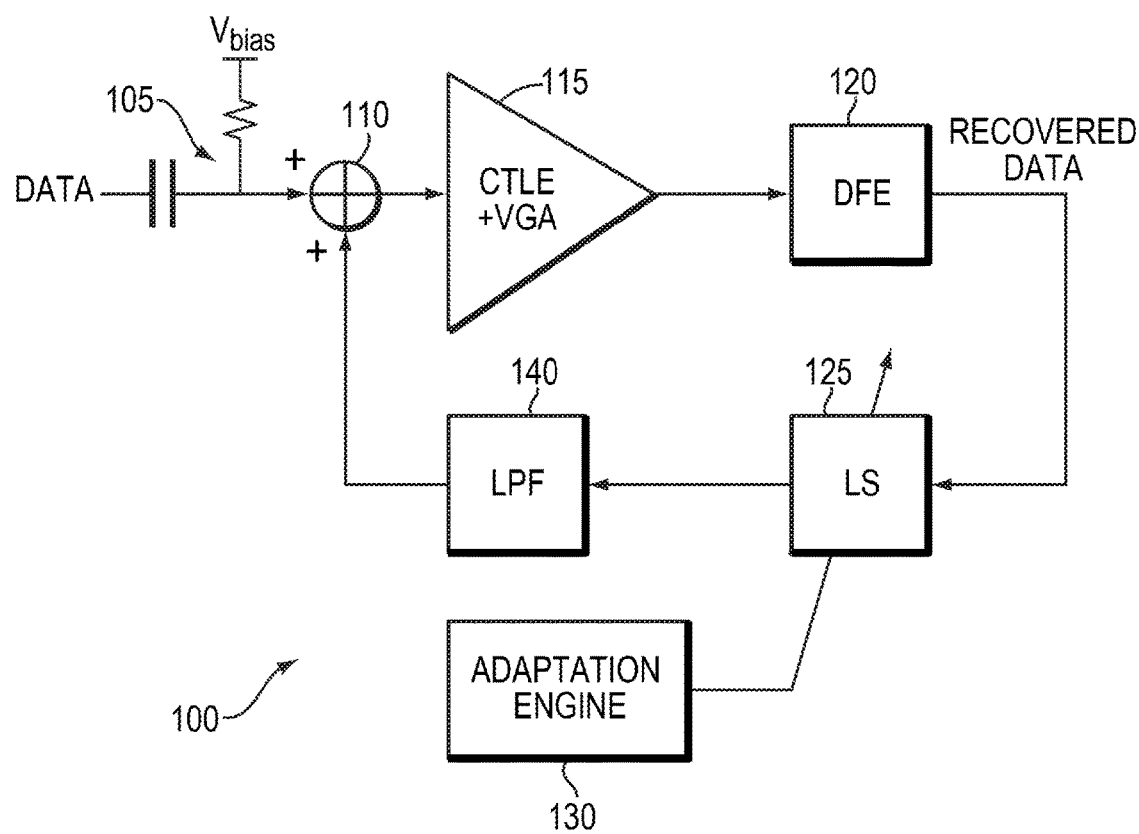
FIG. 1 is a circuit diagram of a self-adaptive baseline wander compensation (BLWC) circuit in one embodiment.

FIG. 1 is a circuit diagram of a data recovery circuit 100 including self-adaptive BLWC in an example embodiment. An AC-coupling network 105, including an AC-coupling capacitor and a resistor coupled to a bias voltage $V_{bias}$, may receive a data input signal and output a corresponding high-pass filtered signal. The high-pass filtered signal may be combined, at a combiner 110, with a compensation signal and input to an continuous time linear equalizer (CTLE) and variable gain amplifier (VGA) 115 (also referred to as "amplifier"). An adaptive equalizer (e.g., a DFE) 120 may generate a recovered data signal based on the amplifier output.

In order to restore low-frequency signal elements that were filtered or reduced from the data signal by the AC-coupling network 105, a level-shifter 125 and low-pass filter (LPF) 140 may generate the compensation signal to include the low-frequency signal elements. In particular, the level shifter 125 may receive the recovered data signal from the adaptive equalizer 120 and adjust the amplitude of the signal to align with that of the high-pass filtered output of the AC-coupling network 105. The low-pass filter 140 then filters the level-shifted signal, thereby providing the compensation signal as a low-frequency component of the data signal to complement the high-pass filtered data signal from the AC-coupling network 105. The combiner 110 (which can be an integrated component of the amplifier 115) combines both signals to provide a reconstituted data signal for recovery by the adaptive equalizer 120.

In order to minimize BLW while maintaining fidelity of the recovered data signal, an adaptation engine 130 may adjust the amplitude of the shift provided by the level shifter 125. The adaptation engine may include logic (e.g., a finite state machine) that selects the amplitude level based on the recovered data output by the DFE. To illustrate the operation of the adaptation engine 130, an embodiment that is absent an adaptation engine is first described below, with reference to FIGS. 2 and 3.

Figure 2:
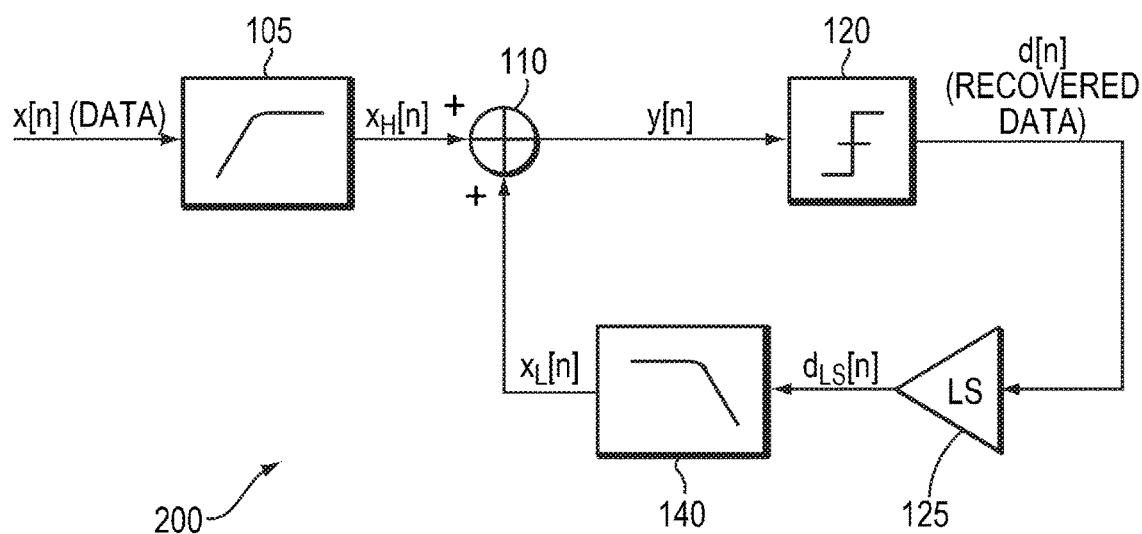
FIG. 2 is a circuit diagram of a BLWC circuit in a further embodiment.

FIG. 2 is a circuit diagram of a data recovery circuit 200 in a further embodiment. The circuit may include a number of the elements described above with reference to FIG. 1, including the AC-coupling network 105, combiner 110, adaptive equalizer 120, level shifter 125 and low-pass filter 140. In contrast to the circuit 100 of FIG. 1, the circuit 200 is absent an adaptation engine, and the level-shifter may be configured to shift the recovered data signal by a fixed amplitude.

The signals occurring at the circuit 200 are labeled as follows:
a) x[n]: data input signal.
b) $x_H[n]$: high-pass filtered output of the AC-coupling network 105.
c) $x_L[n]$: low-pass filtered compensation signal generated by the low-pass filter 140.
d) y[n]: combined data signal of $x_H[n]$ and $x_L[n]$.
e) d[n]: recovered data signal output by the adaptive equalizer 120.
f) $d_{LS}[n]$: level-shifted signal output by the level shifter 125.

Figure 3:
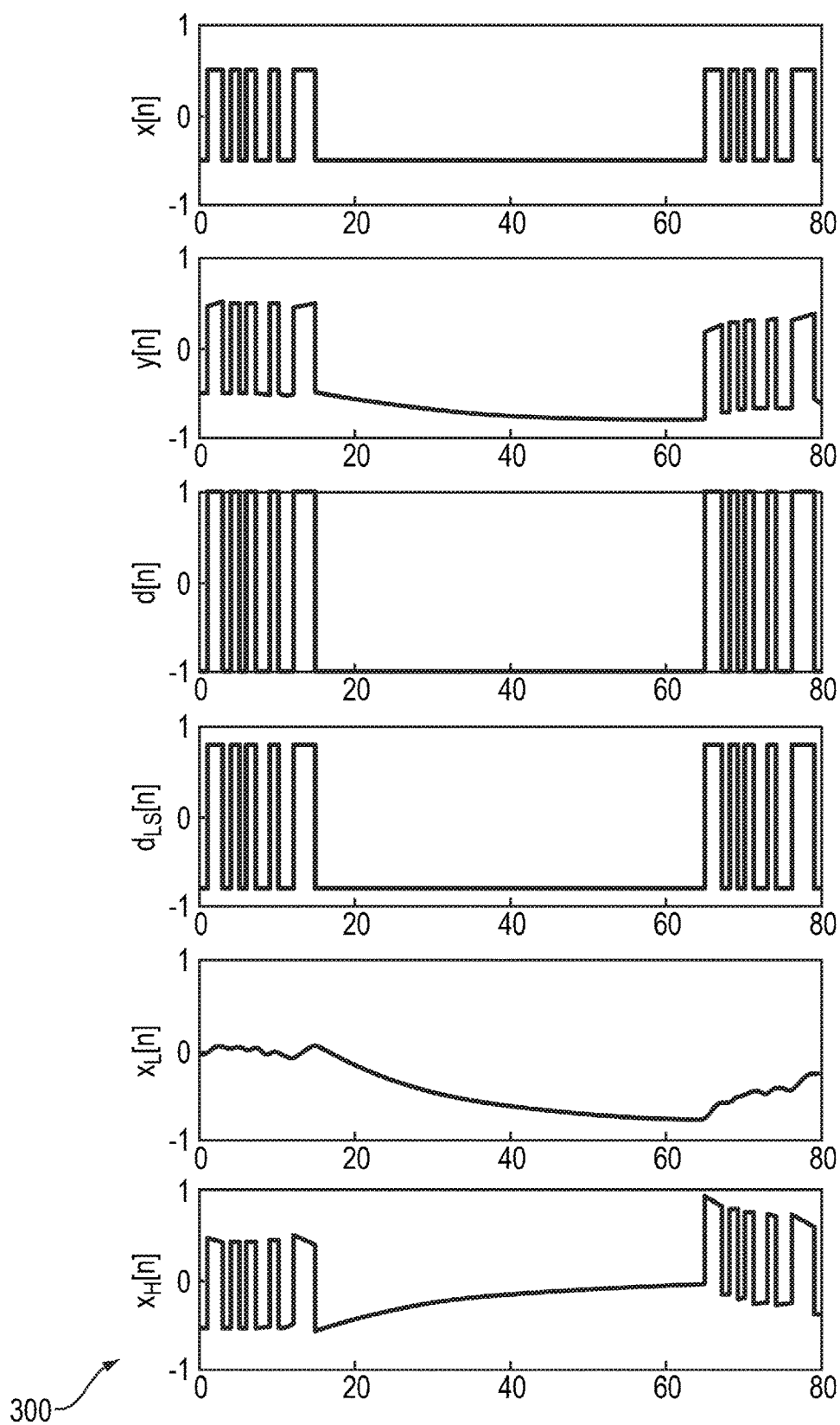
FIG. 3 is a timing diagram illustrating the signals of the BLWC circuit of FIG. 2.

FIG. 3 is a timing diagram 300 illustrating the signals of the BLWC circuit of FIG. 2. As a result of the level-shifter 125 providing a shift of a fixed amplitude to the recovered data signal, the amplitude of $d_{LS}[n]$ does not match the amplitude of x[n]. As a result, the combined data signal y[n] exhibits BLW, as illustrated by the shifting baseline of y[n] relative to x[n].

Figure 4:
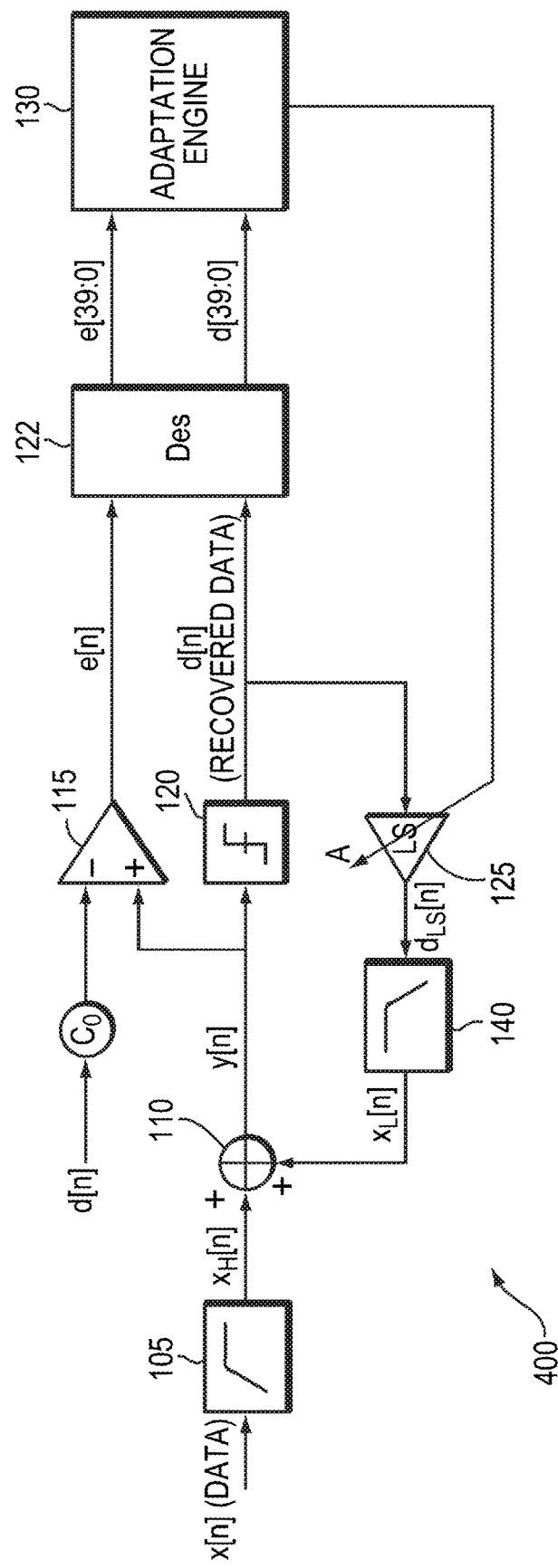
FIG. 4 is a circuit diagram of a BLWC circuit including an adaptation engine.

FIG. 4 is a circuit diagram of a data recovery circuit 400 with self-adaptive BLWC and including the adaptation engine 130. The circuit 400 may include a number of the elements described above with reference to FIG. 1, including the AC-coupling network 105, combiner 110, adaptive equalizer 120, level shifter 125 and low-pass filter 140. Further, the amplifier 115 may be configured as a comparator receiving the combined data signal y[n] as well as the recovered data signal d[n], generating an error signal e[n] as a function of the differential of the inputs. A deserializer 122 may convert the serial error signal e[n] and/or recovered data signal d[n] to corresponding parallel data signals (e[39:0] and d[39:0], respectively).

The adaptation engine 130 may control the amplitude setting of the level shifter 125 to compensate for BLW. The adaptation engine 130 may determine the amplitude setting as follows:

$$x[n] = \sum_{i=-Npre}^{Npost} c_i \cdot d[n-i] \quad \text{Equation 1}$$

$$e[n] = y[n] - c_0 \cdot d[n] \quad \text{Equation 2}$$

As shown in Equation 1 above, the input data x[n] can be represented by the recovered data d[n−i] with the presence of inter-symbol interference (ISI), where $c_i$ is the coefficient of $i^{th}$ cursor. The error bit e[n] is provided by Equation 2.

$$A[n+1] = A[n] - \mu \cdot \text{sgn}(e[n]) \cdot \text{sgn}(\nabla e[n]) \quad \text{Equation 3}$$

$$A[n+1] = A[n] - \mu \cdot \text{sgn}(e[n]) \cdot \text{sgn}\left(\sum_{i=0}^{Npost} d[n-i]\right) \quad \text{Equation 4}$$

An example level shifter gain adaptation algorithm is the sign-sign least mean square (LMS) algorithm shown in Equation 3 and Equation 4. Variable μ is a programmable constant used to control the adaptation speed. The sign of the error data e[n] and the sign of the error data slope may be used to find the next level shifter gain (A[n+1]) responsive to the error indicated by e[n]. Because the post-cursor coefficient $c_i$ (i=1, 2, 3 . . . ) is not predetermined, the algorithm can achieve the LS gain with the presence of post cursor ISI, independent of the decision feedback equalizer (DFE) adaption status. The adaptation engine 130 may calculate A[n+1] continuously, periodically, or in response to a prompt, to determine the amplitude setting for the level shifter 125 that best compensates for BLW.

Figure 5:
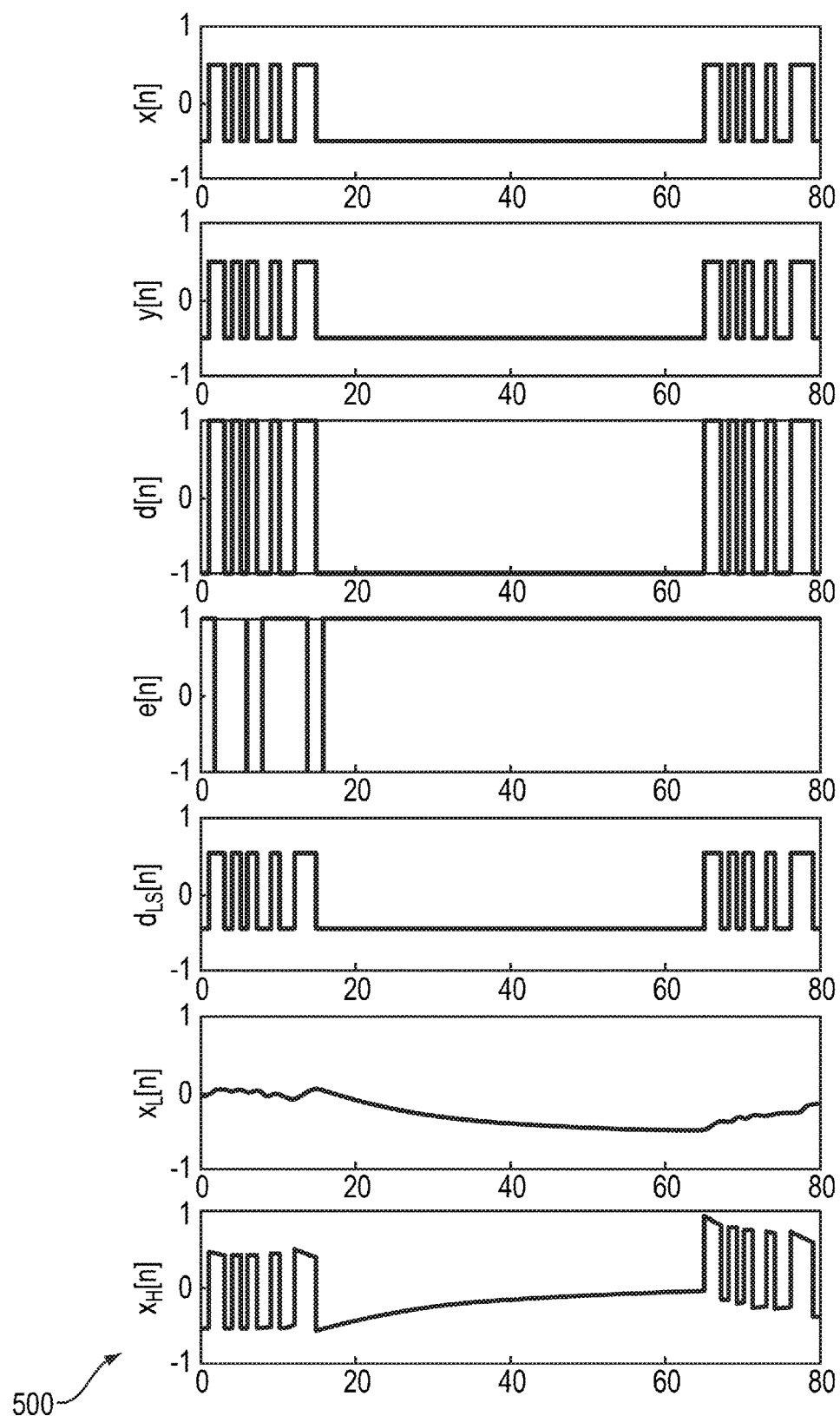
FIG. 5 is a timing diagram illustrating the signals of the BLWC circuit of FIG. 4.

FIG. 5 is a timing diagram 500 illustrating the signals of the data recovery circuit 400 of FIG. 4. In contrast to the timing diagram 300 of FIG. 3, the adaptation engine 130 controls the amplitude of $d_{LS}[n]$ to substantially correspond to the amplitude of x[n]. As a result, the combined data signal y[n] does not exhibit BLW.

Figure 6:
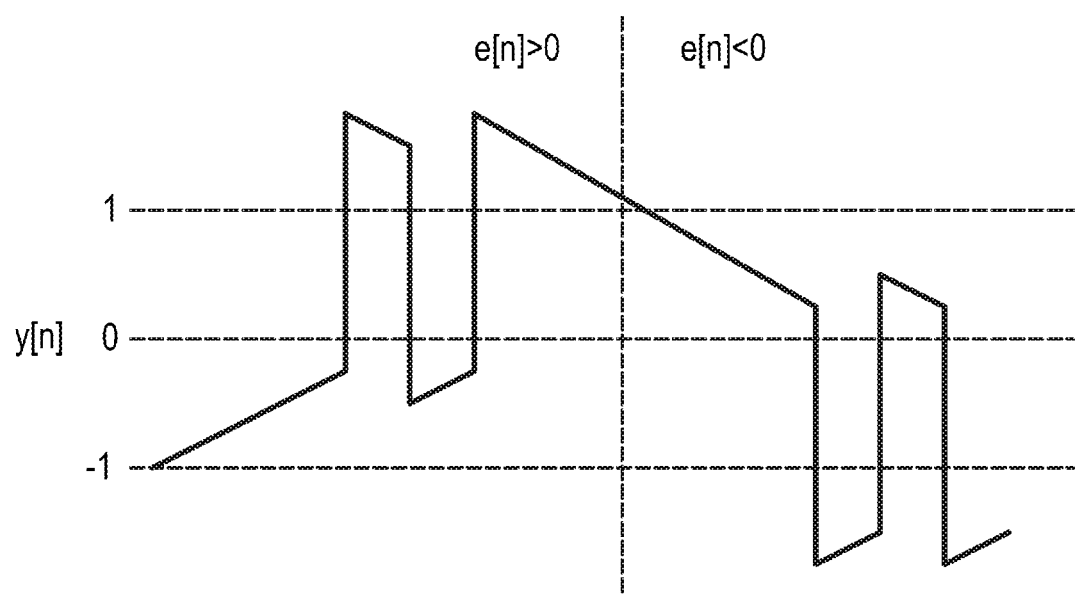
FIG. 6 is a timing diagram illustrating under-compensation of BLW.

FIG. 6 is a timing diagram illustrating under-compensation of BLW. Here, the y[n] waveform exhibits an upward baseline shift as a result of the LS gain A[n] being too small (i.e., "BLWC under-compensation"). When the baseline voltage wanders up as shown in the left half of the waveform (more −1s than 1s in the data sequence, thus $$\sum_{i=0}^{Npost} d[n-i] < 0 \Bigg),$$

error signal e[n] will be larger than 0. Thus, A[n+1] will be larger than A[n] (see Equation 4), and in response, the adaptation engine may increase the LS gain A[n] when the BLW is under compensated.

Figure 7:
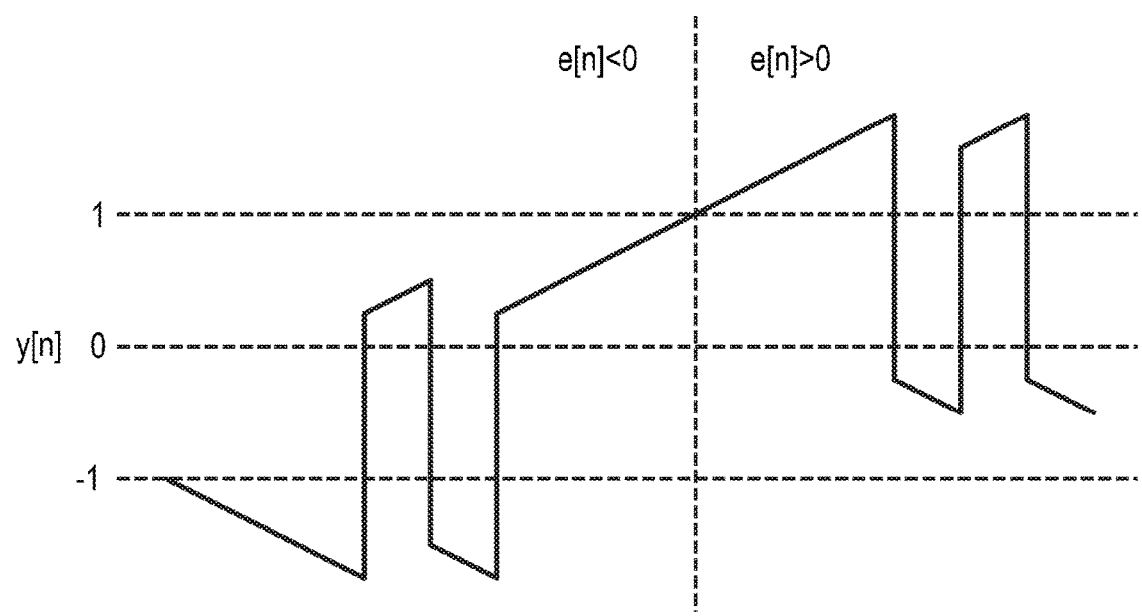
FIG. 7 is a timing diagram illustrating over-compensation of BLW.

FIG. 7 is a timing diagram illustrating over-compensation of BLW. In contrast to FIG. 6, FIG. 7 shows the y[n] waveform when the LS gain A[n] is too large (i.e., "BLWC over-compensation"). Here, the baseline wanders in the opposite direction with the same input data sequence, which causes the sign of e[n] to change. In response, the adaptation engine 130 may reduce the LS gain A[n] to optimize the compensation.

Figure 8:
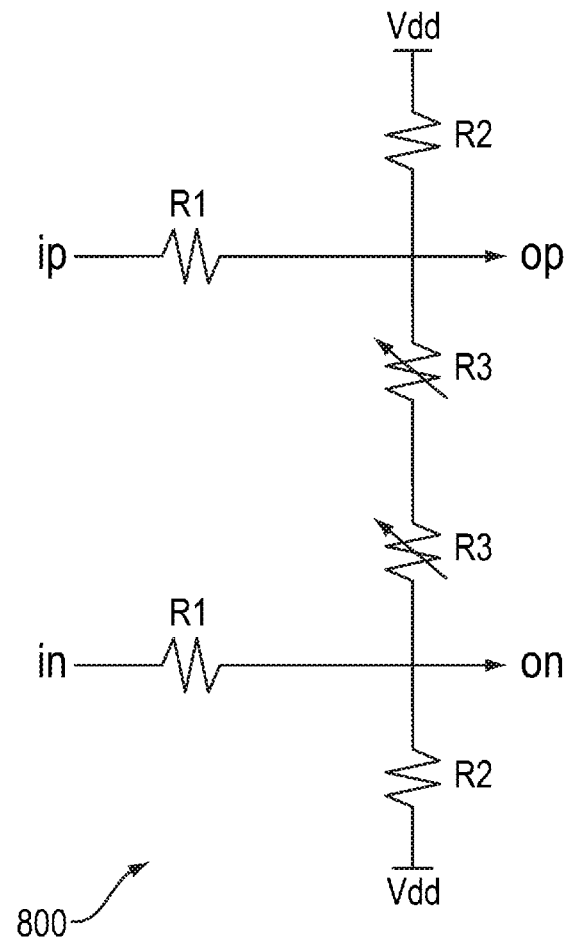
FIG. 8 is a circuit diagram of a level shifter that may be implemented in a BLWC circuit in one embodiment.

FIG. 8 is a circuit diagram of a differential level shifter 800 that may be implemented in the data recovery circuits described above. Resistors R1 and R2 may be used to set the level shifter output common-mode voltage, and adjustable resistor R3 may be varied to change the output amplitude without affecting the output common-mode. Further example embodiments of a differential level shifter are described in U.S. Pat. No. 8,471,601, the entirety of which is incorporated herein by reference.

Embodiments providing adaptive BLWC described above can provide several advantages. For example, a data recovery circuit implementing adaptive BLWC can be optimized to any type of input signal without the need to know the channel types or the transmitter amplitude. Another advantage is that the adaptive loop can continuously optimize the BLWC while transmitter amplitude varies over time, which cannot be achieved without such adaptive architecture. Additionally, the adaptive BLWC circuitry described above is less sensitive to process voltage temperature (PVT) variations, as the adaptive loop can adjust the level shifter gain accordingly. Lastly, the adaptive engine may be implemented in digital logic, which can reduce the design time and renders it portable to different technology.

While example embodiments have been particularly shown and described, it will be understood by those skilled in the art that various changes in form and details may be made therein without departing from the scope of the embodiments encompassed by the appended claims.

What is claimed is:

1. A circuit comprising:
   an AC-coupling network configured to receive a data input signal and output a high-pass filtered data signal;
   an adaptive equalizer configured to output a recovered data signal;
   a level shifter configured to output a level-shifted signal as a function of the recovered data signal;
   a low-pass filter configured to output a low-pass filtered signal as a function of the level-shifted signal, the low-pass filtered signal corresponding to a low-frequency component of the data input signal, the adaptive equalizer generating the recovered data signal as a function of the low-pass filtered signal and the high-pass filtered data signal;
   an adaptation engine configured to control the level shifter to adjust an amplitude of the level-shifted signal as a function of the recovered data signal; and
   a comparator configured to receive a first input, the first input being a combination of the low-pass filtered signal and high-pass filtered data signal, the comparator outputting an error signal to the adaptation engine.

2. The circuit of claim 1, wherein the comparator is further configured to receive a second input corresponding to the recovered data signal, the comparator outputting the error signal as a function of a difference between the first and second inputs.

3. The circuit of claim 1, wherein the adaptation engine is further configured to adjust the amplitude of the level-shifted signal as a function of the error signal.

4. The circuit of claim 1, further comprising a deserializer configured to convert the error signal to a parallel error signal.

5. The circuit of claim 4, wherein the adaptation engine is further configured to receive the parallel error signal.

6. The circuit of claim 1, further comprising a combiner configured to combine the high-pass filtered data signal and low-pass filtered signal and output a combined data signal.

7. The circuit of claim 6, wherein the adaptive equalizer is further configured to output the recovered data signal as a function of the combined data signal.

8. The circuit of claim 1, wherein the adaptive equalizer includes a decision feedback equalizer (DFE).

9. A circuit comprising:
   an AC-coupling network configured to receive a data input signal and output a high-pass filtered data signal;
   an adaptive equalizer configured to output a recovered data signal;
   a level shifter configured to output a level-shifted signal as a function of the recovered data signal;
   a low-pass filter configured to output a low-pass filtered signal as a function of the level-shifted signal, the low-pass filtered signal corresponding to a low-frequency component of the data input signal, the adaptive equalizer generating the recovered data signal as a function of the low-pass filtered signal and the high-pass filtered data signal;
   an adaptation engine configured to control the level shifter to adjust an amplitude of the level-shifted signal as a function of the recovered data signal; and
   a deserializer configured to convert the recovered data signal to a parallel data signal.

10. The circuit of claim 9, wherein the adaptation engine is further configured to receive the parallel data signal.

11. A method of recovering a data signal, comprising:
   filtering a data input signal at an AC-coupling network to generate a high-pass filtered data signal;
   level-shifting a recovered data signal to generate a level-shifted signal;
   filtering the level-shifted signal to output a low-pass filtered signal, the low-pass filtered signal corresponding to a low-frequency component of the data input signal;
   generating the recovered data signal as a function of the low-pass filtered signal and the high-pass filtered data signal;

adjusting an amplitude of the level-shifted signal as a function of the recovered data signal; and comparing a first input, the first input being a combination of the low-pass filtered signal and high-pass filtered data signal and outputting an error signal.

12. The method of claim 11, further comprising receiving a second input corresponding to the recovered data signal and outputting the error signal as a function of a difference between the first and second inputs.

13. The method of claim 11, further comprising adjusting the amplitude of the level-shifted signal as a function of the error signal.

14. The method of claim 11, further comprising converting the error signal to a parallel error signal.

15. The method of claim 11, further comprising combining the high-pass filtered data signal and low-pass filtered signal and outputting a combined data signal.

16. The method of claim 15, further comprising outputting the recovered data signal as a function of the combined data signal.

17. A method of recovering a data signal, comprising:

filtering a data input signal at an AC-coupling network to generate a high-pass filtered data signal;

level-shifting a recovered data signal to generate a level-shifted signal;

filtering the level-shifted signal to output a low-pass filtered signal, the low-pass filtered signal corresponding to a low-frequency component of the data input signal;

generating the recovered data signal as a function of the low-pass filtered signal and the high-pass filtered data signal;

adjusting an amplitude of the level-shifted signal as a function of the recovered data signal; and converting the recovered data signal to a parallel data signal.

* * * * *